United States Patent [19]

Lesk et al.

US005300187A

[11] Patent Number: 5,300,187

[45] Date of Patent: Apr. 5, 1994

[54] METHOD OF REMOVING CONTAMINANTS

[75] Inventors: Israel A. Lesk, Phoenix, Ariz.; Young Limb, Austin, Tex.; Philip J. Tobin, Austin, Tex.; John Franka, Austin, Tex.; Paul T. Lin, Austin, Tex.; Jonathan C. Dahm, Austin, Tex.; Gary L. Huffman, Austin, Tex.; Bich-Yen Nguyen, Austin, Tex.

[73] Assignee: Motorola, Inc., Schaumburg, Ill.

[21] Appl. No.: 940,108

[22] Filed: Sep. 3, 1992

[51] Int. Cl.$^5$ ............... B44C 1/22; H01L 21/306
[52] U.S. Cl. ........................... 156/628; 156/646; 437/13
[58] Field of Search ............... 156/628, 646; 437/13

[56] References Cited

U.S. PATENT DOCUMENTS

| | | | |
|---|---|---|---|
| 3,556,879 | 1/1971 | Mayer | 457/13 |
| 4,159,917 | 7/1979 | Gluck | 148/1.5 |
| 4,231,809 | 11/1980 | Schmidt | 148/1.5 |
| 5,028,560 | 7/1991 | Tsukamoto et al. | 437/81 |
| 5,174,881 | 12/1992 | Iwasaki et al. | 118/715 |

Primary Examiner—Anthony McFarlane
Assistant Examiner—Nhat D. Phan
Attorney, Agent, or Firm—Miriam Jackson

[57] ABSTRACT

Contaminants are removed from a semiconductor material by heating the semiconductor material to temperature within the range of a minimum temperature where a halogen compound will decompose to halogen atoms without the use of ultraviolet irradiation and react with contaminants present on the semiconductor material and a maximum temperature of 800° C., wherein less than or equal to approximately 50 Angstroms of oxide is formed on the semiconductor material. The ambient in which the semiconductor material is heated is an ambient comprised of a nonreactive gas and a halogen compound for at least a time sufficient to remove a substantial amount of contaminants from the semiconductor material.

22 Claims, No Drawings

METHOD OF REMOVING CONTAMINANTS

BACKGROUND OF THE INVENTION

This invention relates, in general, to a method of removing contaminants, including, but not limited to, a method of cleaning contaminants from a semiconductor material.

Many methods are used to remove contaminants from a semiconductor material. In the past, one method involved exposing a semiconductor material to an anhydrous cleaning gas mixture containing one part by volume of nitric oxide and one part by volume of hydrogen chloride with a carrier gas of at least four parts molecular nitrogen at a temperature range of 850° to 1100° C. for a period of less than 10 minutes.

Another cleaning method entails exposing a semiconductor material to a temperature of 900° to 1300° C. in an ambient which includes hydrogen chloride and about 0.5 to 1% oxygen by volume to grow a protective silicon dioxide film on the surface of the semiconductor material to a thickness of not more than about 150 Angstroms for a period of 20 to 30 minutes.

Although these processes may remove some contaminants, it is desirable to improve the efficiency of contaminant removal so that a substantial amount of contaminants are removed, because contamination problems can be detrimental to the manufacture of semiconductor devices. Contamination can result in poor reliability and poor electrical performance. In particular, contaminants can cause the formation of gate oxide layers which have low rupture voltages and electrical junctions with high leakage, as well as other failures.

SUMMARY OF THE INVENTION

A method of removing contaminants, comprising the steps of heating a semiconductor material in an ambient comprised of a nonreactive gas and a halogen compound at a temperature within the range of a minimum temperature where the halogen compound will decompose to halogen atoms without the use of ultraviolet irradiation and react with contaminants present on the semiconductor material to form contaminant-halides and where the contaminant-halides are volatile and a maximum temperature less than or equal to approximately 800° C. An oxide layer of less than or equal to approximately 50 Angstroms is formed on the semiconductor material, and the semiconductor material is heated for at least a time sufficient to remove a substantial amount of the contaminants.

DETAILED DESCRIPTION OF THE PREFERRED EMBODIMENTS

In a preferred embodiment, the present invention comprises providing a semiconductor material. The semiconductor material includes a semiconductor material in and on which semiconductor devices are fabricated. The semiconductor material typically has contaminants present in and on it. Contaminants, as used here, include metallic contaminants, such as iron, nickel, chromium, and copper, and ions mobile in an oxide layer, including sodium, and potassium. Contaminants to be removed are those that are on the semiconductor surface as well as those that may diffuse to the semiconductor surface during the removal process.

The semiconductor material is placed in a chamber with walls that do not react with a halogen bearing gases and having a means for keeping a specified temperature, pressure, and ambient. The chamber should also have a means for introducing gases into the chamber and drawing off any gases (exhaust) present in the chamber. An example of such a chamber would be a diffusion tube used in semiconductor processing.

While the semiconductor material is introduced into the chamber, the ambient in the chamber is preferably comprised of a nonreactive or inert gas (one that is nonreactive with the semiconductor material) and a halogen compound. In this way, the halogen compound is available to react with the contaminants as soon as possible, before the the temperature of the semiconductor material has risen appreciably, thus preventing a significant level of diffusion of the contaminants into the semiconductor material by the exposure of the semiconductor material to the temperature of the chamber. In the past, there was no motivation to do this because it was believed that higher temperatures greater than 850° C. were necessary for the halogen compound to react with the contaminants present on the semiconductor material. In this embodiment, it is preferable to use a temperature of approximately 800° C. or less, because the halogen compound is introduced to the semiconductor material while it is being heated up from room temperature to 800° C. A temperature greater than approximately 800° C. will increase the amount of the contaminants that can be dissolved in the semiconductor material and increase the rate of diffusion of the contaminants into the semiconductor material, thus lowering the amount of contaminants that are removed.

In some situations, there may be some safety concerns with introducing the halogen compound while the semiconductor material is being inserted into the chamber. Recently, a new type of diffusion furnace was developed that allows the insertion of the semiconductor material into a closed loading chamber without exposing the semiconductor material to any heat. In these furnaces, the halogen compound and the nonreactive gas can be present in the loading chamber while the semiconductor material is still at room temperature. After the semiconductor material is loaded into the loading chamber, the semiconductor material is exposed to heat.

In some cases, it may not be desirable to introduce the semiconductor material into an ambient comprised of a halogen compound in furnaces that do not have the separate loading chamber. In this case, the ambient in the chamber can consist essentially of the nonreactive gas while the semiconductor material is being introduced into the chamber which is at the desired temperature. In this embodiment, it is preferable that the introduction of the halogen compound take place as soon as the semiconductor material is placed into the chamber and the chamber is closed or sealed. Introducing the halogen compound as soon as possible prevents or minimizes the diffusion of contaminants into the semiconductor material.

In this embodiment, as well as in the embodiment disclosed above, it is preferable that the temperature be as low as possible to keep the solubility of the contaminants in the semiconductor material as low as possible thus limiting the amount of contaminants that dissolve in the semiconductor material. From this standpoint, the preferable temperature range is approximately 300°-600° C. However, practical concerns may dictate using higher temperatures. The maximum temperature in this embodiment is less than or equal to 700° C. The solid solubility of contaminants in the semiconductor material is low enough at temperatures less than or equal to 700° C., even though the diffusivity of contaminants can be high at temperatures as low as 700° C., so that a substantial amount of contaminants are removed.

The minimum temperature at which the chamber is held is the temperature at which a halogen compound can provide halogen atoms, without the use of ultraviolet irradiation excitation, which react with contaminants present in the chamber and on the semiconductor material to form contaminant-halide compounds. However, it may be desirable to use a plasma, or other energy adding process, to decompose the halogen compound to increase the available halogen atoms which react with the contaminants. In addition, the temperature should be a temperature at which the contaminant-halide compounds remain volatile so that they are drawn off by the exhaust. In a preferred embodiment, the minimum temperature is approximately 300° C. At 300° C., it is not believed to be necessary to use an energy adding process to increase the available halogen atoms.

It was unexpected that the halogen atoms would be available to react with the contaminants at temperatures lower than 800° C., and in particular, temperatures as low as 300°–600° C., without the need for ultraviolet light to help decompose the halogen compound into halogen atoms. In the past, hydrogen chloride (HCl) has been used for the removal of sodium when growing oxide layers, and to improve the interface between the semiconductor material and the oxide layer. HCl has also been used to etch a small amount of silicon before an epitaxial layer is grown on a silicon substrate. However, some of these processes use a temperature of 850° C. or greater. At this temperature, a substantial amount of transition metals are not removed because they diffuse into the semiconductor material, as has been discussed above. Also, a substantial amount of oxide can grow on the semiconductor material, and serve as a barrier to the removal of contaminants. In addition, in some of the processes, either the partial pressure of HCl or the amount of time the process is performed is not adequate to provide a substantial removal of contaminants. The recent availability of a machine which is able to show the concentration of contaminants present on the surface of the semiconductor material, rather than in the semiconductor material, made it possible to verify that contaminants present on the semiconductor material had been removed using low temperatures between 300°–800° C. This machine is called a total reflection x-ray fluorescence spectrometer, and is commercially available through several manufacturers.

In either of the above cases (where the halogen gas is introduced during insertion or after insertion of the semiconductor material into the chamber), the semiconductor material is preferably exposed to these gases for a sufficient time to effectively remove a substantial amount of the contaminants. This time is equal to a time which allows for the reaction of the halogen compound with the contaminants and volatilization of the contaminant-halide compounds. This time will vary depending on the temperature, pressure, gas flows, and the configuration of the chamber that is used.

The semiconductor material must be exposed to at least the equivalent of a partial pressure of the halogen compound of approximately 20 torr at 650° C. for 20–30 minutes in a diffusion tube. Because a variation in temperature and pressure of the chamber and the time at that temperature and pressure will affect the reaction rate, a specific range of partial pressures of the halogen compound cannot be specified. The higher the temperature, the lower the partial pressure of the halogen compound can be, and vice versa. For example, it was discovered that a process having a partial pressure of the halogen compound of 0.4 torr, at a temperature of 635° C., for a time of 15 minutes does not remove a substantial amount of contaminants from a semiconductor material.

It was discovered that a way to improve the efficiency of removing chromium from the semiconductor material, was to expose the semiconductor material to oxygen ($O_2$) with the halogen compound and/or the nonreactive gas. A low level of oxygen is also desirable in removing hydrocarbons from the semiconductor material. In addition, at temperatures above approximately 700° C., it is desirable to form an oxide layer on the semiconductor material to protect the surface of the semiconductor material from pitting by the halogen compound. However, in the present invention, where the ambient is comprised partly of oxygen, the temperature, pressure, and ambient are such that little oxidation of the semiconductor material takes place.

It is important that little grown oxide is present on the surface of the semiconductor material, because this grown oxide traps any contaminants in the semiconductor material. Little grown oxide is defined as less than or equal to approximately 50 Angstroms. This grown oxide does include a thin native oxide (less than 30 Angstroms) which grows on the semiconductor material by being exposed to the air. For example, it was found that a process using a temperature ramped from 700° to 1050° C., at 1 atmosphere, with 5% HCl and 95% $O_2$ for 40 minutes did not adequately remove a substantial amount of contaminants because an oxide layer greater than 50 Angstroms is grown in this atmosphere. In addition, the temperature is ramped too high before the cleaning process has enough time to work.

Preferably, the nonreactive gas is comprised substantially of nitrogen. Other nonreactive gases, such as argon, can be used. Nitrogen is preferred because it is readily available and inexpensive. Also, nitrogen is lighter than argon, so steady state is reached faster in an ambient comprised of nitrogen. If steady state is reached faster, the amount of time the semiconductor material must be exposed to the cleaning process can be shortened. In addition, more effective cleaning will take place because the contaminants will be removed faster, thus reducing the amount of contaminants that can diffuse into the semiconductor material.

The method of the present invention can also be used to remove contamination from the reaction chamber or diffusion tube itself. The process can be carried out without introducing the semiconductor material.

EXAMPLE #1

A first specific example of a preferred embodiment of the cleaning process is described below. The semiconductor material is inserted into a chamber, a diffusion tube, having a temperature of approximately 800° C. and a pressure of approximately 1 atmosphere in an ambient comprised of 0.5 to 10% hydrogen chloride as the halogen compound, 0 to 5% oxygen and the balance nitrogen as the nonreactive gas. Equivalent partial pressures may be used if pressure of the ambient is changed. Using a much smaller partial pressure of the halogen compound will increase the amount of time the semiconductor must be cleaned, which is undesirable if the amount of time is too long. It is preferable to use HCl as the halogen compound because it is very reactive, readily available, and does not deplete the earth's ozone layer.

The semiconductor material is inserted into the diffusion tube having the ambient specified above. Then, the semiconductor material is annealed or heated at this temperature for 20 to 30 minutes.

In order to more effectively remove iron and chromium, it was discovered that at least 3% hydrogen chloride is necessary at a pressure of 1 atmosphere.

The semiconductor material may then be removed from the diffusion tube or further processing may be started in the same diffusion tube, such as oxidation, diffusion, or annealing. An oxide layer grown on the surface of the semiconductor material after the cleaning process of the present invention is performed will have superior qualities because a substantial amount of contaminants will have been removed from the semiconductor material. This is particularly important when forming a gate oxide layer.

EXAMPLE #2

A second specific example of the cleaning process is described below. The semiconductor material is inserted into a chamber, a diffusion tube, having a temperature of approximately 500°-650° C. and a pressure of approximately 1 atmosphere in an ambient comprised of 0 to 5% oxygen and the balance nitrogen.

Once the semiconductor material has been inserted into the diffusion tube, and the diffusion tube is closed, hydrogen chloride is introduced into the diffusion tube as soon as possible so that the ambient is then comprised of 0.5 to 10% hydrogen chloride, 0 to 5% oxygen, and the balance nitrogen. The semiconductor material is annealed or heated at this temperature for at least approximately 20 to 30 minutes. The remainder of the cleaning process proceeds as that described in example #1.

As can be readily seen, a method of removing a substantial amount of contaminants from a semiconductor material has been provided. Semiconductor material processed according to the present invention results in the fabrication of semiconductor devices having good electrical performance and good reliability.

We claim:

1. A method of removing contaminants, comprising the steps of:
   providing a semiconductor material; and
   heating the semiconductor material without the use of ultraviolet irradiation in an ambient comprised of a nonreactive gas and a halogen compound and at a temperature within the range of a minimum temperature where the halogen compound decomposes to halogen atoms, without the use of ultraviolet irradiation, which react with the contaminants present on the semiconductor material to form contaminant-halides and where the contaminant-halides are volatile and a maximum temperature less than or equal to approximately 800° C., wherein an oxide layer of less than or equal to approximately 50 Angstroms is formed on the semiconductor material during the heating, and further wherein a partial pressure of the halogen compound in the ambient is at least sufficient to remove a substantial amount of contaminants and wherein the semiconductor material is heated for at least a time sufficient to remove a substantial amount of the contaminants.

2. The method of claim 1 wherein the step of heating comprises heating in the ambient comprised of an equivalent of less than or equal to approximately 10% hydrogen chloride as the halogen compound at a pressure of approximately 1 atmosphere.

3. The method of claim 1 wherein the step of heating comprises heating in the ambient comprised of approximately 5% hydrogen chloride as the halogen compound at a pressure of approximately 1 atmosphere.

4. The method of claim 1 wherein the step of heating comprises heating in the ambient having at least the equivalent of a partial pressure of the halogen compound of approximately 20 torr at 650° C. for 20-30 minutes.

5. The method of claim 1 wherein the step of heating comprises heating in the ambient consisting essentially of approximately 0 to 5% oxygen, 0.5 to 10% hydrogen chloride as the halogen compound, and the balance nitrogen as the nonreactive gas.

6. The method of claim 1 wherein the step of heating comprises heating in the ambient comprised of nitrogen as the nonreactive gas.

7. The method of claim 1 wherein the step of heating comprises heating for at least approximately 20 minutes.

8. The method of claim 1 wherein the step of heating comprises introducing the semiconductor material to the ambient comprised of the halogen compound and the nonreactive gas while the semiconductor material is heated from room temperature to the temperature within the range of the minimum temperature and the maximum temperature.

9. The method of claim 1 wherein the step of heating comprises introducing the semiconductor material directly into the ambient comprised of the nonreactive gas and then subsequently introducing the halogen compound into the ambient, and wherein the maximum temperature is less than 700° C.

10. The method of claim 1 wherein the step of heating comprises heating the semiconductor material to the temperature within the range of the minimum temperature and the maximum temperature less than 700° C.

11. The method of claim 1 wherein the step of heating comprises heating the semiconductor material to the temperature within the range of the minimum temperature equal to 300° C. and the maximum temperature equal to 600° C.

12. The method of claim 1 wherein the step of heating comprises heating the semiconductor material in the ambient which is substantially free of oxygen.

13. The method of claim 1 further comprising the steps of:
    increasing the temperature to a temperature at which oxidation of the semiconductor material takes place; and
    oxidizing the semiconductor material to grow an oxide layer on the semiconductor material.

14. A method of processing a semiconductor material, comprising the steps of:
    providing a semiconductor material;
    introducing the semiconductor material into a chamber having a temperature within the range of a minimum temperature where a halogen compound decomposes to halogen atoms, without ultraviolet irradiation, which react with contaminants present on the semiconductor material to form contaminant-halides and the contaminant-halides remain volatile and a maximum temperature of approximately 600° C. and an ambient comprised of a nonreactive gas;

closing the chamber;

introducing a halogen compound into the ambient of the chamber after the step of closing the chamber; and heating the semiconductor material without the use of ultraviolet irradiation for a time sufficient to remove a substantial amount of contaminants from the semiconductor material, wherein conditions are such that an oxide layer of less than or equal to approximately 50 angstroms is formed on the semiconductor material during the heating.

15. The method of claim 14 wherein the step of introducing the semiconductor material into the chamber comprises introducing the semiconductor material into the chamber in the ambient which is further comprised of oxygen.

16. The method of claim 14 wherein the step of introducing the semiconductor material into the chamber comprises introducing the semiconductor material into the chamber in the ambient which is further comprised of oxygen and the step of heating comprises heating in the ambient having at least the equivalent of a partial pressure of the halogen compound of approximately 20 torr at 650° C. for 20-30 minutes.

17. The method of claim 14 wherein the step of introducing the semiconductor material into the chamber comprises introducing the semiconductor material into the chamber in the ambient which is further comprised of oxygen and the step of heating comprises heating in the ambient comprised of 0 to 5% oxygen, 0.5 to 10.0% hydrogen chloride as the halogen compound, and the balance nitrogen as the nonreactive gas.

18. The method of claim 14 wherein the step of heating comprises heating in the ambient comprised of nitrogen as the nonreactive gas.

19. The method of claim 14 wherein the step of heating comprises heating for at least approximately 20 minutes.

20. The method of claim 14 wherein the step of heating comprises heating the semiconductor material in the ambient which is substantially free of oxygen.

21. A method of processing a semiconductor material, comprising the steps of:

providing a semiconductor material;

introducing the semiconductor material into a chamber having a temperature within the range of a minimum temperature equal to 300° C. where a halogen compound decomposes to halogen atoms, without ultraviolet irradiation, which react with contaminants present on the semiconductor material to form contaminant-halides and the contaminant-halides remain volatile and a maximum temperature of approximately 600° C. and an ambient comprised of a nonreactive gas;

closing the chamber;

introducing a halogen compound into the ambient of the chamber after the step of closing the chamber; and heating the semiconductor material without the use of ultraviolet irradiation for a time sufficient to remove a substantial amount of contaminants from the semiconductor material, wherein conditions are such that an oxide layer of less than or equal to approximately 50 angstroms is formed on the semiconductor material during the heating.

22. A method of processing a semiconductor device, comprising the steps of:

providing a semiconductor material; and heating the semiconductor material at a temperature of between approximately 300° to 600° C. in an ambient comprised of a nonreactive gas and a halogen compound without the use of ultraviolet irradiation, wherein the semiconductor material has an oxide layer of less than or equal to approximately 50 angstroms formed thereon during the heating.

* * * * *